（12) United States Patent
Tanaka

(10) Patent No.: US 10,333,537 B2
(45) Date of Patent: Jun. 25, 2019

(54) ATOMIC OSCILLATOR AND A METHOD OF GENERATING ATOMIC OSCILLATION

(71) Applicant: Seiko Epson Corporation, Tokyo (JP)

(72) Inventor: Noriaki Tanaka, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/846,877

(22) Filed: Dec. 19, 2017

(65) Prior Publication Data
US 2018/0175872 A1 Jun. 21, 2018

(30) Foreign Application Priority Data

Dec. 20, 2016 (JP) .................................. 2016-246281

(51) Int. Cl.
| G04F 5/14 | (2006.01) |
| H03B 17/00 | (2006.01) |
| H03L 7/26 | (2006.01) |
| G06F 1/10 | (2006.01) |

(52) U.S. Cl.
CPC ................ H03L 7/26 (2013.01); G04F 5/145 (2013.01); G06F 1/10 (2013.01); H03B 17/00 (2013.01)

(58) Field of Classification Search
CPC ........... G04F 5/14; G04F 5/145; H03B 17/00; H03L 7/26
USPC .................................................... 331/3, 94.1
See application file for complete search history.

(56) References Cited

U.S. PATENT DOCUMENTS

| 3,363,193 | A | * | 1/1968 | Arnold | ...................... | H03L 7/26 |
| | | | | | | 331/18 |
| 3,862,365 | A | * | 1/1975 | Kobayashi | ................ | G04F 5/14 |
| | | | | | | 348/505 |
| 6,300,841 | B1 | * | 10/2001 | Atsumi | ...................... | H03L 7/26 |
| | | | | | | 331/3 |
| 2011/0057737 | A1 | * | 3/2011 | Aoyama | .................. | G04F 5/145 |
| | | | | | | 331/94.1 |
| 2011/0109395 | A1 | * | 5/2011 | Chindo | ................... | G04F 5/145 |
| | | | | | | 331/94.1 |

(Continued)

FOREIGN PATENT DOCUMENTS

| JP | 64-054817 A | 3/1989 |
| JP | 03-135227 A | 6/1991 |

(Continued)

Primary Examiner — Levi Gannon
(74) Attorney, Agent, or Firm — Harness, Dickey & Pierce, P.L.C.

(57) ABSTRACT

An atomic oscillator includes: an atomic cell containing metal atoms; a light source generating light to be emitted to the atomic cell; a driver outputting a driving signal for driving the light source; a light detector detecting the light having passed through the atomic cell; a phase detector detecting an output of the light detector; a voltage controlled oscillator having an oscillation frequency adjusted based on the output detected by the phase detector; a phase modulator phase modulating an output signal of the voltage controlled oscillator and outputting the phase modulated signal; a frequency multiplier which outputs a microwave to the driver, the microwave being obtained by multiplying a frequency of the phase modulated signal; and a frequency divider which frequency divides the output signal of the voltage controlled oscillator and outputs the frequency divided output signal to the phase detector and the phase modulator.

20 Claims, 5 Drawing Sheets

(56) References Cited

U.S. PATENT DOCUMENTS

2015/0091660 A1* 4/2015 Tanaka .................. H03L 1/00
331/94.1

FOREIGN PATENT DOCUMENTS

| JP | 04-257119 A | 9/1992 |
|----|-------------|--------|
| JP | 09-098086 A | 4/1997 |
| JP | 11-205138 A | 7/1999 |
| JP | 2008-131122 A | 6/2008 |
| JP | 2011-155367 A | 8/2011 |
| JP | 2014-096629 A | 5/2014 |
| JP | 2014-179710 A | 9/2014 |

* cited by examiner

ATOMIC OSCILLATOR AND A METHOD OF GENERATING ATOMIC OSCILLATION

BACKGROUND

1. Technical Field

The present invention relates to an atomic oscillator and a method of generating atomic oscillation.

2. Related Art

Atomic oscillators that oscillate on the basis of energy transition of atoms of an alkali metal such as rubidium (Rb) or cesium (Cs) are known as oscillators having high-precision oscillation characteristics for a long period of time.

In general, an operation principle of the atomic oscillator is roughly classified into a method using a double resonance phenomenon based on light and microwaves and a method using Coherent Population Trapping (CPT) based on two light beams having different frequencies (wavelengths).

For example, JP-A-2008-131122 discloses a rubidium atomic oscillator using a double resonance phenomenon. JP-A-2014-179710 discloses an atomic oscillator using coherent population trapping.

The atomic oscillator using coherent population trapping can be made smaller than the atomic oscillator using double resonance phenomenon, and thus is expected to be mounted on various apparatuses.

The atomic oscillator using coherent population trapping includes a gas cell filled with metal atoms in a gaseous state, a light emission unit that irradiates the metal atoms in the gas cell with a laser beam including two resonance light beams (resonance light pair) having different frequencies, and a light detection unit that detects the laser beam (emitted light) having passed through the gas cell. When a difference between the frequencies of the resonance light pair has a specific value, Electromagnetically Induced Transparency (EIT) in which both of the two resonance light beams pass through the gas cell without being absorbed into the metal atoms in the gas cell occurs, and an EIT signal which is a steep signal generated accompanying the EIT phenomenon is detected by a light detector. Since the EIT signal has a fixed value which is determined on the basis of the type of metal atom present, it is possible to configure a high-precision oscillator that oscillates a stable frequency by detecting the EIT signal.

Incidentally, the rubidium atomic oscillator using a double resonance phenomenon disclosed in JP-A-2008-131122 has a feedback loop for stabilizing a frequency which is input to an OMU (atomic resonator) in the vicinity of a resonance frequency. In the feedback loop, a low frequency oscillator is provided in order to generate a phase modulation signal used in a phase modulation unit and a phase detection signal used in a phase detector (see FIG. 1 of JP-A-2008-131122).

In addition, the atomic oscillator using coherent population trapping disclosed in JP-A-2014-179710 includes a wavelength control circuit and a frequency control circuit. Each of the wavelength control circuit and the frequency control circuit includes a low frequency oscillator in order to generate a phase modulation signal and a phase detection signal (see FIG. 2 of JP-A-2014-179710).

As described above, the atomic oscillator in the related art includes one or more low frequency oscillators as independent circuits, and thus there is a problem in that the size, current consumption, and cost of the atomic oscillator increase.

SUMMARY

An advantage of some aspects of the invention is to solve at least a part of the problems described above, and the invention can be implemented as the following forms or application examples.

Application Example 1

An atomic oscillator according to this application example includes an atomic cell which contains metal atoms, a light source which generates light to be emitted to the atomic cell, a driver that outputs a driving signal for driving the light source, a light detector which detects the light having passed through the atomic cell, a phase detector which detects an output of the light detector, a voltage controlled oscillator which has an oscillation frequency adjusted on the basis of the output detected by the phase detector, a phase modulator which performs phase modulation of an output signal of the voltage controlled oscillator and outputs the signal having been subjected to the phase modulation, a frequency multiplier which outputs a microwave, which is obtained by multiplying a frequency of the signal having been subjected to the phase modulation, to the driver, and a frequency divider which performs frequency division on the output signal of the voltage controlled oscillator and outputs the output signal having been subjected to the frequency division to the phase detector and the phase modulator.

According to this application example, a first phase modulation signal serving as a reference signal of a first phase modulator and a first phase detection signal serving as a reference signal of a first phase detector are generated by a first frequency divider from the output signal of the voltage controlled oscillator. Therefore, it is not necessary to include a low frequency oscillator as an independent circuit in order to generate the first phase modulation signal and the first phase detection signal.

Application Example 2

In the application example, it is preferable that the first feedback loop is a feedback control circuit that performs control for bringing the center frequency of the light into close to an atomic resonance frequency of the atomic cell.

According to this application example, the first feedback loop performs feedback control for bringing the center frequency of the light close to an atomic resonance frequency of the atomic cell. For this reason, it is possible to stably cause a double resonance phenomenon in the atomic cell.

Application Example 3

In the application example, it is preferable that the light source generates the light including a resonance light pair for causing electromagnetically induced transparency in the atomic cell, and the first feedback loop may be a feedback control circuit that generates the driving signal of the light source so as to stably generate the light including the resonance light pair.

According to this application example, the first feedback loop performs feedback control for generating light including a resonance light pair so as to cause electromagnetically induced transparency in the atomic cell. For this reason, it is possible to stably cause electromagnetically induced transparency in the atomic cell.

Application Example 4

In the application example, it is preferable that the first phase modulation signal is generated from the first phase detection signal by a first filter.

According to this application example, the first phase modulation signal is generated from the first phase detection signal by the first filter. Therefore, it is not necessary to include a low frequency oscillator as an independent circuit in order to generate the first phase modulation signal, and it is possible to synchronize the phase of the first phase detection signal with the phase of the first phase modulation signal.

Application Example 5

In the application example, it is preferable that the atomic oscillator includes a constant current circuit that generates a bias current for the driving signal, a second phase detector that detects an output of the light detector, and a second feedback loop configured to include the constant current circuit, the driver, the light source, the atomic cell, the light detector, and the second phase detector. In the second feedback loop, it is preferable that the second phase detector detects the output of the light detector on the basis of a second phase detection signal and outputs the detected output, and the constant current circuit receives inputs of a bias fluctuation signal, which is obtained by synchronizing the second phase detection signal with a phase, and a level signal corresponding to the output detected by the second phase detector, adjusts a value of the bias current on the basis of the bias fluctuation signal and the level signal and outputs the adjusted value to the driver, and the driver superimposes the bias current on the microwave and outputs the driving signal.

According to this application example, the atomic oscillator includes the constant current circuit that generates a bias current, and includes the second feedback loop that superimposes the bias current on the microwave, outputs a driving signal for driving the light source, and controls the bias current so as to cause light absorption into the metal atoms. For this reason, it is possible to stably cause light absorption in the atomic cell.

Application Example 6

In the application example, it is preferable that the second phase detection signal is generated from the output signal of the voltage controlled oscillator by a second frequency divider so as to have a frequency lower than that of the first phase detection signal, and the bias fluctuation signal is generated from the second phase detection signal by a second filter.

According to this application example, the second phase detection signal serving as a reference signal of the second phase detector is generated by the second frequency divider from the output signal of the voltage controlled oscillator included in the first feedback loop. In addition, a bias fluctuation signal is generated from the second phase detection signal by the second filter. Therefore, it is not necessary to include a low frequency oscillator as an independent circuit in order to generate the bias fluctuation signal, and it is easy to synchronize the phase of the second phase detection signal with the phase of the bias fluctuation signal. Further, the second phase detection signal has a frequency that is different from (lower than) that of the first phase detection signal, and thus the phases of the bias fluctuation signal and the first phase modulation signal do not overlap each other. As a result, it is possible to reliably detect an output of the light detector, which includes individual phase components, by the first phase detector and the second phase detector.

Application Example 7

An electronic device according to this application example includes the atomic oscillator according to any one of the application examples.

According to this application example, the atomic oscillator does not need to be provided with a low frequency oscillator as an independent circuit, and thus it is possible to achieve reductions in power consumption, size, and cost of the atomic oscillator, as compared with a case where the atomic oscillator is provided with the low frequency oscillator. Therefore, the electronic device including the atomic oscillator can also achieve reductions in power consumption, size, and cost.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

First Exemplary Embodiment

Figure 1:
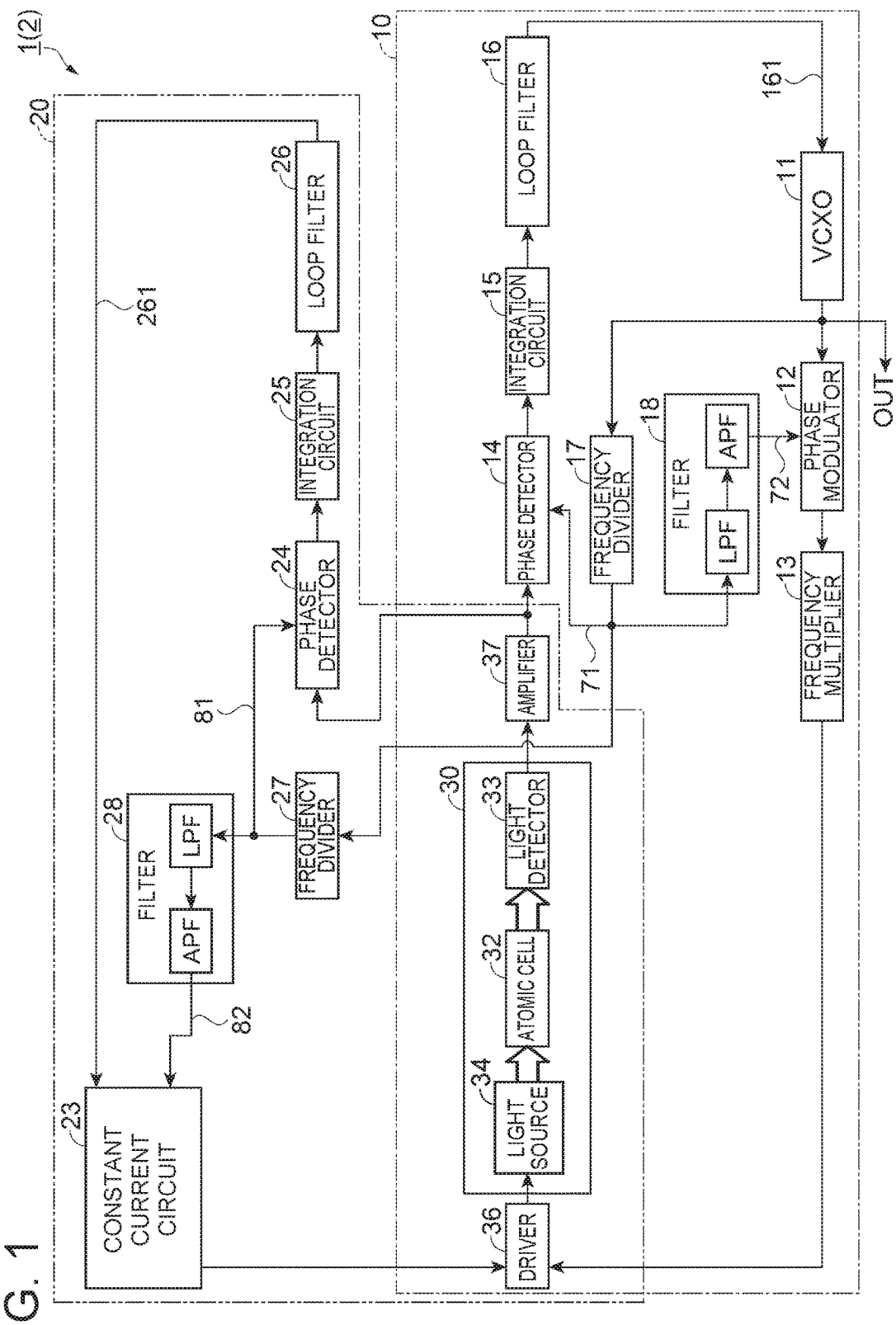
FIG. 1 is a diagram illustrating the overall configuration of an atomic oscillator using coherent population trapping.

Hereinafter, a first exemplary embodiment of an atomic oscillator 1 to which the invention is applied will be described with reference to the accompanying drawings. In the first exemplary embodiment, as the atomic oscillator 1 to which the invention is applied, a cesium atomic oscillator 2 using coherent population trapping will be described as an example.

In the drawings to be referred to in the following description, for convenience of description and illustration, the horizontal and vertical dimensions of members or portions may differ from the actual dimensions. In addition, components other than components desired for description may not be illustrated in the drawing.

Configuration of Atomic Oscillator

FIG. 1 is a diagram illustrating the overall configuration of a cesium atomic oscillator 2 according to this exemplary embodiment. The cesium atomic oscillator 2 includes a first feedback loop 10 (indicated by an alternate long and short dashes line) and a second feedback loop 20 (indicated by an alternate long and two short dashes line).

The first feedback loop 10 is a feedback control circuit that causes a light source 31 to generate light including a resonance light pair so as to stably cause electromagnetically induced transparency (hereinafter, referred to as an EIT phenomenon) in a quantum interference device 30, thereby stabilizing an oscillation frequency of a voltage control quartz crystal oscillator 11 (hereinafter, referred to as a VCXO 11). Thereby, the cesium atomic oscillator 2 can supply an output signal OUT (for example, a signal having a frequency of 10 MHz) having an extremely high frequency stability from the VCXO 11.

The quantum interference device 30 includes an atomic cell 32 containing cesium atoms (metal atoms), a light source 31 that generates light including a resonance light pair emitted to the atomic cell 32, and a light detector 33 that detects the emitted light having passed through the atomic cell 32.

The first feedback loop 10 includes a driver 36 that drives the light source 31, the quantum interference device 30, an amplifier 37 that amplifies the emitted light detected by the light detector 33, a first phase detector 14 that detects an output of the light detector 33 which is amplified by the amplifier 37, an integration circuit 15 that integrates the output detected by the first phase detector 14, and a loop filter 16 that converts the output of the integration circuit 15 into a level signal 161 of a stable voltage. The first feedback loop 10 is configured to further include the VCXO 11 that receives the output signal of the loop filter 16 to adjust an oscillation frequency, a first phase modulator 12 that performs phase modulation of the output signal OUT of the VCXO 11 in order to apply phase modulation to a driving signal for driving the light source 31, and a frequency multiplier 13 that multiplies the output signal OUT having been subjected to the phase modulation. The VCXO 11 is a quartz crystal oscillator of which the oscillation frequency is adjusted on the basis of a voltage to be applied.

The first phase modulator 12 applies phase modulation to the driving signal for driving the light source 31 by using a first phase modulation signal 72 as a reference signal in order to apply phase modulation to the light emitted to the atomic cell 32. In this exemplary embodiment, the first phase modulator 12 applies phase modulation to the output signal OUT of the VCXO 11 in accordance with the first phase modulation signal 72. The signal having been subjected to the phase modulation is an input signal of the frequency multiplier 13 and is frequency multiplied by the frequency multiplier 13, thereby outputting microwaves having been subjected to phase modulation. The microwave having been subjected to phase modulation serves as a driving signal generation signal for generating a driving signal for driving the light source 31 in the driver 36.

The first phase detector 14 detects an output of the light detector 33 which is amplified by the amplifier 37 by using the first phase detection signal 71 as a reference signal. As described later, the first phase modulation signal 72 is generated from the first phase detection signal 71, and thus the phases of the first phase detection signal 71 and the first phase modulation signal 72 are synchronous with each other. For this reason, the first phase detection signal 71 can perform phase detection of the output of the light detector 33 based on light generated by a driving signal including a microwave having been subjected to phase modulation by the first phase modulation signal 72.

The output detected by the first phase detector 14 is converted into the level signal 161 of the stable voltage by the integration circuit 15 and the loop filter 16 and is input to the VCXO 11.

The first phase detection signal 71 is generated by performing frequency division of the output signal OUT of the VCXO 11 by the frequency divider 17 as a first frequency divider. The first phase modulation signal 72 is generated by removing a harmonic component from the first phase detection signal 71 which is a periodic signal of a rectangular wave by the filter 18 as a first filter. Therefore, the first phase modulation signal 72 is synchronous with the first phase detection signal 71, and is ideally a periodic signal of a sine wave. For example, in this exemplary embodiment, the output signal OUT is 10 MHz, the first phase detection signal 71 generated by performing frequency division of the output signal OUT is a rectangular wave signal of 128 Hz, and the first phase modulation signal 72 is a sine wave signal of 128 Hz.

The filter 18 includes a low pass filter LPF and an all pass filter APF, removes a harmonic component of the first phase detection signal 71 by the low pass filter LPF, and generates the first phase modulation signal 72 by performing phase adjustment taking a phase deviation occurring in the quantum interference device 30 into consideration by the all pass filter APF.

As described above, in this exemplary embodiment, the first phase detection signal 71 is generated from the output signal OUT of the VCXO 11 by the frequency divider 17, and the first phase modulation signal 72 is generated from the first phase detection signal 71 by the filter 18. For this reason, a low frequency oscillator provided in an atomic oscillator of the related art is not necessary.

In addition, feedback control for causing the light source 31 to generate light including a resonance light pair is performed so that an EIT phenomenon stably occurs in the quantum interference device 30 by the above-described first feedback loop 10. As a result, an oscillation frequency of the VCXO 11 can be highly stabilized, and thus it is possible to supply the output signal OUT having extremely high frequency stability as an output of the cesium atomic oscillator 2.

The second feedback loop 20 is configured to include a driver 36 that drives the light source 31, the quantum interference device 30, the amplifier 37 that amplifies emitted light detected by the light detector 33, a second phase detector 24 that detects an output of the light detector 33 which is amplified by the amplifier 37, an integration circuit 25 that integrates the output detected by the second phase detector 24, a loop filter 26 that converts the output of the integration circuit 25 into a level signal 261 of a stable voltage, and a constant current circuit 23 that receives a bias fluctuation signal 82 to be described later and the level signal 261 from the loop filter 26 to generate a bias current for a driving signal for driving the light source 31.

The second phase detector 24 detects an output of the light detector 33 which is amplified by the amplifier 37 and output the detected output by using the second phase detection signal 81 as a reference signal. The second phase detection signal 81 is generated by performing frequency division of the first phase detection signal 71 which is an output of the frequency divider 17 by the frequency divider 27 as a second frequency divider. As described later, the bias fluctuation signal 82 is generated from the second phase detection signal 81, and thus phases of the second phase detection signal 81 and the bias fluctuation signal 82 are synchronous with each other. For this reason, the second phase detection signal 81 can perform phase detection of the output of the light detector 33 based on light generated by the driving signal having a bias current fluctuating by the bias fluctuation signal 82. In a case where the second phase detection signal 81 is generated by directly dividing the output signal OUT of the VCXO 11 without going through the frequency divider 17, the second frequency divider may be set to be a frequency divider having a frequency division ratio which is a combination of the frequency divider 17 and the frequency divider 27.

The bias fluctuation signal 82 is generated by removing a harmonic component from the second phase detection signal 81 which is a periodic signal of a rectangular wave by the filter 28 as a second filter. Therefore, the bias fluctuation signal 82 is synchronous with the second phase detection signal 81, and is ideally a periodic signal of a sine wave.

For example, in this exemplary embodiment, the first phase detection signal 71 is 128 Hz, the second phase detection signal 81 generated by performing frequency division of the first phase detection signal 71 is a rectangular wave signal of 16 Hz, and the bias fluctuation signal 82 is a sine wave signal of 16 Hz.

The filter 28 includes a low pass filter LPF and an all pass filter APF, removes a harmonic component of the second phase detection signal 81 by the low pass filter LPF, and generates the bias fluctuation signal 82 by performing phase adjustment taking a phase deviation occurring in the quantum interference device 30 into consideration by the all pass filter APF.

The output detected by the second phase detector 24 is converted into the level signal 261 of the stable voltage by the integration circuit 25 and the loop filter 26 and is input to the constant current circuit 23.

The constant current circuit 23 generates a bias current superimposed on a microwave on the basis of the bias fluctuation signal 82 and the level signal 261 corresponding to the output detected by the second phase detector 24. Specifically, the center value of the bias current is adjusted by the level signal 261, so that light having a wavelength (central wavelength) for stably causing light absorption is generated from the light source 31. A fluctuation cycle of the bias current is adjusted by the bias fluctuation signal 82, so that feedback control of the second feedback loop 20 for stabilizing the wavelength of light generated from the light source 31 to a wavelength for causing light absorption is realized.

The driver 36 superimposes a bias current generated by the constant current circuit 23 on a microwave which is output from the frequency multiplier 13 to output a driving signal for driving the light source 31.

As described in this exemplary embodiment, the second phase detection signal 81 is generated by the frequency divider 27 from the first phase detection signal 71 generated from the output signal OUT of the VCXO 11, and the bias fluctuation signal 82 is generated by the filter 28 from the second phase detection signal 81. For this reason, a low frequency oscillator provided in an atomic oscillator of the related art is not necessary.

Further, the first phase detection signal 71 and the second phase detection signal 81 have different frequencies, and thus the first phase modulation signal 72 generated from the first phase detection signal 71 and the bias fluctuation signal 82 generated from the second phase detection signal 81 have different phases. For this reason, the phase of modulation based on the first phase modulation signal 72 and the phase of fluctuation based on the bias fluctuation signal 82 do not overlap each other, and thus it is possible to reliably detect the phases.

In addition, feedback control for causing the light source 31 to generate light including a resonance light pair with a wavelength (central wavelength) for stably causing light absorption based on alkali metal atoms in the quantum interference device 30 is configured by the above-described second feedback loop 20. As a result, the light absorption based on the alkali metal atoms stably occur, and thus it is possible to reliably perform the control of an EIT phenomenon by the above-described first feedback loop 10.

Next, components included in the first feedback loop 10 or the second feedback loop 20 will be described in detail.

The light source 31 is configured to selectively emit laser beams (light including a resonance light pair) having two oscillation frequencies ($\omega 1$, $\omega 2$), that is, coupling light and probe light in the same direction at the same time, and can be independently changed for each frequency. Thereby, it is possible to cause alkali metal atoms in the internal space of the atomic cell 32 to absorb light accompanied by an EIT signal by simultaneously irradiating the alkali metal atoms with two laser beams having different frequencies and controlling the frequencies of the laser beams.

The light source 31 may be a light source for emitting resonance light, and the light source to be used may be a semiconductor laser such as a Vertical Cavity Surface Emitting Laser (VCSEL) or an edge emitting laser. In addition, the temperature of the light source 31 is adjusted to a predetermined temperature by a temperature adjustment element (a heating resistor, a Peltier element, or the like) (not shown).

The light detector 33 may have a frequency characteristic with photodetection sensitivity for detecting the intensity of emitted light that is emitted through the internal space of the atomic cell 32 in a variable frequency region of a laser beam, and the light detector to be used may be a light detector (light receiving element) such as a solar cell or a photodiode.

The atomic cell 32 includes a housing including an incidence window covering one opening and an emission window covering the other opening, and alkali metal atoms are in the internal space of the housing. In addition, the atomic cell 32 is configured such that a virtual line connecting the center portion of the incidence window and the center portion of the emission window is superimposed on the optical axis on a surface perpendicular to the optical axis linearly connecting the light source 31 and the light detector 33.

The alkali metal atoms in the internal space of the atomic cell 32 are present at a constant concentration in a gaseous state in accordance with saturated vapor pressure determined from the temperature of the internal space and the degree of vacuum. In this exemplary embodiment, cesium (Cs) which is a quantum absorber is added as the alkali metal atoms, and a noble gas such as argon or neon, or an inert gas such as nitrogen is added as a buffer gas as desired.

The loop filters 16 and 26 are low pass filters that average direct current signals transmitted from the integration circuits 15 and 25 and convert the averaged signals into direct current signals at a stable voltage level with little alternating current components. Further, the loop filters 16 and 26 determine a transmission characteristic for stably performing feedback control in the first feedback loop 10 and the second feedback loop 20.

Principle of Quantum Interference Device

Next, the principle of the quantum interference device 30 will be described.

Figure 2:
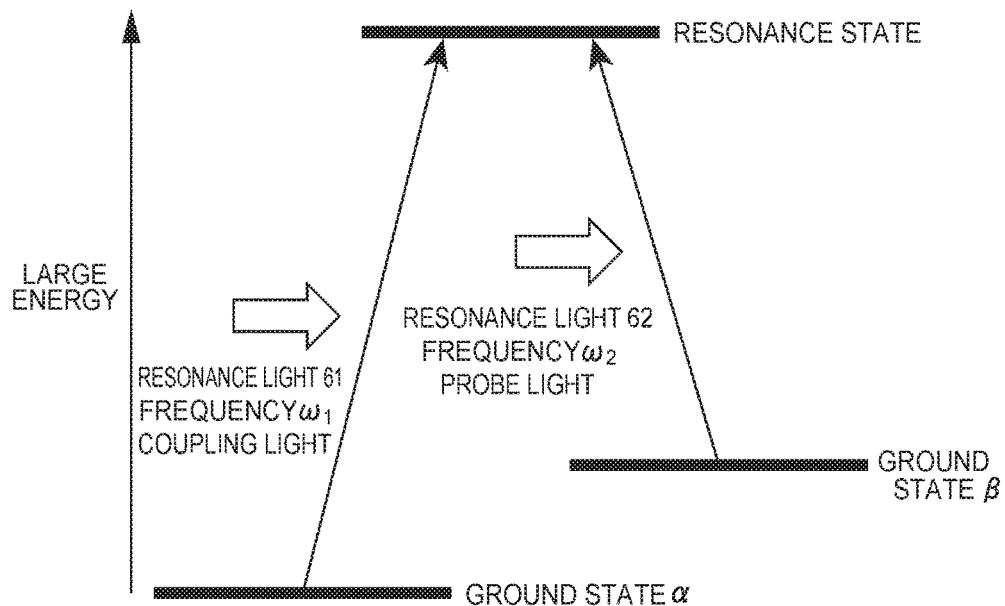
FIG. 2 is a diagram illustrating an energy state of an alkali metal.
Figure 3:
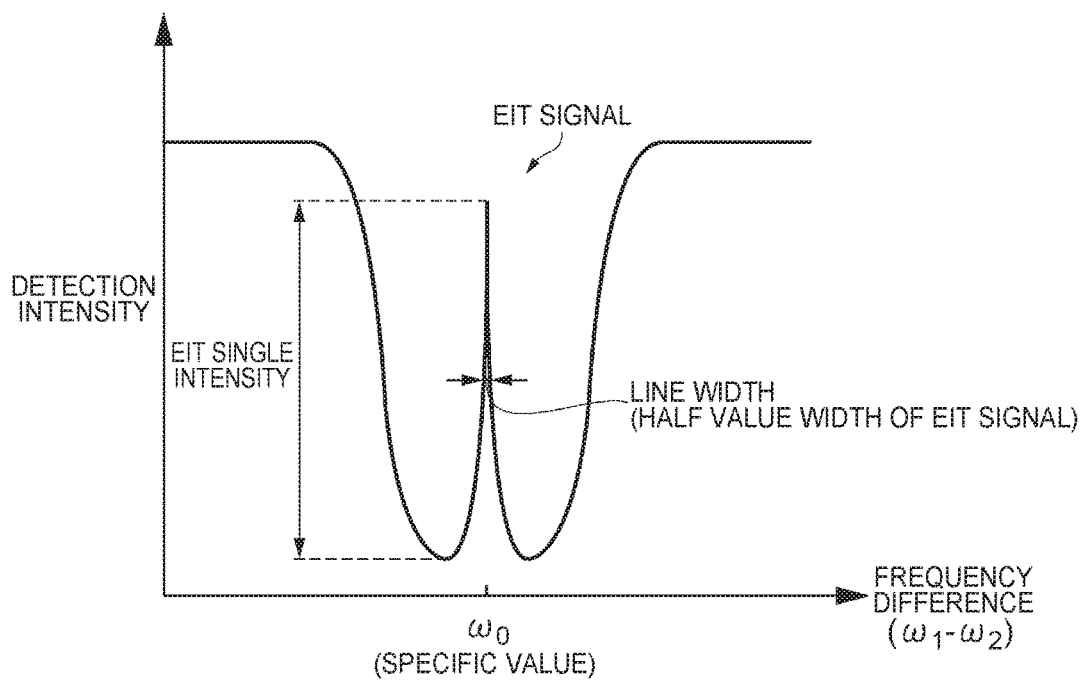
FIG. 3 is a graph illustrating a relationship between the intensity of emitted light and a difference in frequency between two light beams emitted.

FIG. 2 is a diagram illustrating an energy state of an alkali metal, and FIG. 3 is a graph illustrating a relationship between the intensity of emitted light detected by the light detector 33 and a difference in frequency between two light beams emitted from the light source 31.

As described above, in the quantum interference device 30, a laser beam is emitted toward the atomic cell 32 from the light source 31, and the emitted light having passed through the atomic cell 32 is detected by the light detector 33. The internal space of the atomic cell 32 is uniformly filled with alkali metal atoms in a gaseous state, and the alkali metal atoms have energy levels of a 3-level system as illustrated in FIG. 2 and may be set to be in three states of two ground states (ground states α and β) having different energy levels and one resonance state. The ground state α is an energy state lower than the ground state β.

The laser beam emitted from the light source 31 includes two resonance light beams 61 and 62 having different frequencies. When the above-described alkali metal atoms in a gaseous state are irradiated with the two resonance light beams 61 and 62, a light absorption rate (light transmittance) in the alkali metal atoms of the resonance light beams 61 and 62 changes depending on a difference ($\omega 1-\omega 2$) between the frequency $\omega 1$ of the resonance light 61 and the frequency $\omega 2$ of the resonance light 62.

When the difference ($\omega 1-\omega 2$) between the frequency $\omega 1$ of the resonance light 61 and the frequency $\omega 2$ of the resonance light 62 is consistent with a frequency equivalent to an energy difference between the ground state α and the ground state β, resonance from each of the ground states α and β to a resonance state is stopped. At this time, both the resonance light beams 61 and 62 pass without being absorbed into the alkali metal atoms. Such a phenomenon is the above-described electromagnetically induced transparency (EIT).

For example, when the light source 31 fixes the frequency $\omega 1$ of the resonance light 61 and changes the frequency $\omega 2$ of the resonance light 62, the detection intensity of the light detector 33 steeply rises as illustrated in FIG. 3 when the difference ($\omega 1-\omega 2$) between the frequency $\omega 1$ of the resonance light 61 and the frequency $\omega 2$ of the resonance light 62 is consistent with a frequency equivalent to an energy difference between the ground state α and the ground state β (appearance of the EIT signal).

Such a steep signal is detected as an EIT signal. The EIT signal has a fixed value which is determined on the basis of the type of alkali metal atom, and thus it is possible to configure the high-precision cesium atomic oscillator 2 by using the EIT signal.

Operational Effects

As described above, the cesium atomic oscillator 2 (atomic oscillator 1) according to this exemplary embodiment can generate the first phase detection signal 71, the first phase modulation signal 72, the second phase detection signal 81, and the bias fluctuation signal 82 by the frequency dividers 17 and 27 and the filters 18 and 28 without including one or more low frequency oscillators as independent circuits. For this reason, it is possible to suppress increases in the size and current consumption of the cesium atomic oscillator 2 (atomic oscillator 1) and to suppress an increase in cost.

Modification Example 1

Although the first exemplary embodiment of the invention has been described so far, modifications can be made, for example, as follows without departing from the scope of the invention. In the following description, the same components as those in the first exemplary embodiment will be denoted by the same reference numerals and signs or a description to that effect will be clearly given, and thus a repeated description will be omitted.

Figure 4:
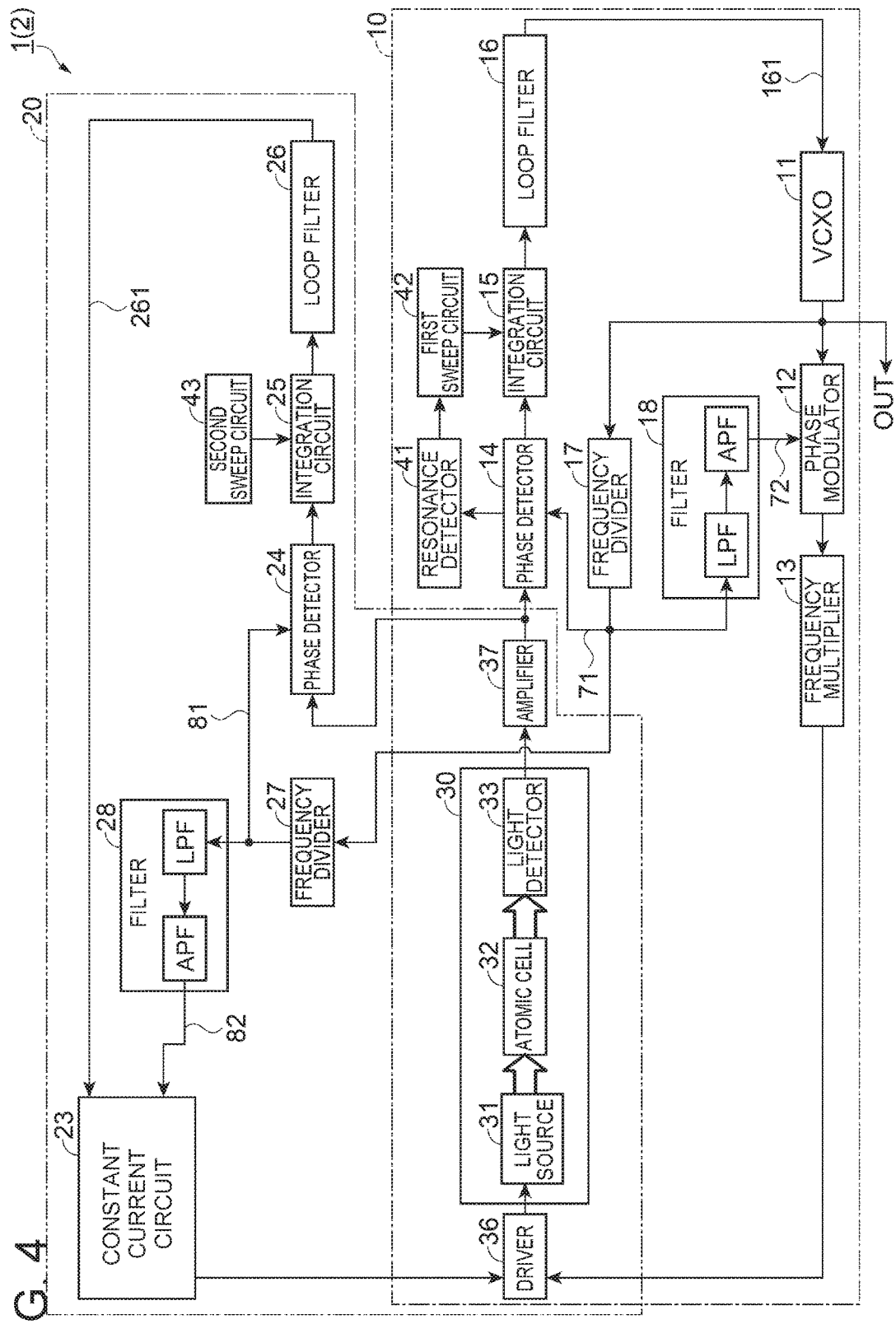
FIG. 4 is a diagram illustrating the overall configuration of an atomic oscillator according to Modification Example 1.

FIG. 4 is a diagram illustrating a configuration of the cesium atomic oscillator 2 in which a resonance detector 41, a first sweep circuit 42, and a second sweep circuit 43 are added to the configuration of the cesium atomic oscillator 2 illustrated in FIG. 1. As described in the first exemplary embodiment, the first feedback loop 10 performs feedback control for causing the light source 31 to generate light including a resonance light pair so that an EIT phenomenon stably occurs in the quantum interference device 30, and the second feedback loop 20 performs feedback control for causing the light source 31 to generate light having a wavelength for stably causing light absorption into alkali metal atoms in the quantum interference device 30. In order to lock a wavelength of light in such a stable state through the feedback control, light set to be in a stable state is found while changing (sweeping) a wavelength (or frequency) little by little. This sweep processing is processing which is particularly used in a rising state of the circuit after the power supply of the cesium atomic oscillator 2 is turned on. The resonance detector 41, the first sweep circuit 42, and the second sweep circuit 43 are components for performing the sweep processing.

In the first feedback loop 10, the first sweep circuit 42 sweeps light generated by the light source 31 until the resonance detector 41 detects the occurrence of the EIT phenomenon from the output of the first phase detector 14. For this reason, sweep is started by the first sweep circuit 42 when the power supply of the cesium atomic oscillator 2 is turned on, and it is possible to terminate the sweep by the first sweep circuit 42 when an EIT phenomenon occurs.

On the other hand, in the second feedback loop 20, the second sweep circuit 43 is controlled by a controller (for example, a microcomputer) not shown in the drawing so as to sweep light until light absorption into alkali metal atoms occurs and to stop the sweep when the light absorption occurs. Thereafter, the cesium atomic oscillator 2 stabilizes the wavelength of light generated by the light source 31 through the feedback control of the second feedback loop 20.

In the cesium atomic oscillator 2, after the power supply is turned on, it is preferable that the wavelength of light is first adjusted so that light absorption occurs through the sweep and feedback control by the second sweep circuit 43 in the second feedback loop 20, and light including a resonance light pair causing an EIT phenomenon is then determined through the sweep and feedback control by the resonance detector 41 and the first sweep circuit 42 in the first feedback loop 10.

As described above, after light absorption occurs by the second sweep circuit 43 and an EIT phenomenon occurs by the first sweep circuit 42, the EIT phenomenon of light generated by the light source 31 is stabilized through the feedback control of the first feedback loop 10 and the feedback control of the second feedback loop 20. Operations and functions of the first feedback loop 10 and the second feedback loop 20 at this time are as described in the first exemplary embodiment.

Therefore, according to this modification example, a low frequency oscillator is not provided as an independent circuit, and thus it is possible to suppress increases in the size and current consumption of the cesium atomic oscillator 2 (atomic oscillator 1), to suppress an increase in cost, and to reliably cause coherent population trapping after the power supply is turned on.

Second Exemplary Embodiment

Next, a second exemplary embodiment of an atomic oscillator 1 to which the invention is applied will be described with reference to the accompanying drawings. In the drawings to be referred to in the following description, for convenience of description and illustration, the horizontal and vertical dimensions of members or portions may differ from the actual dimensions. In addition, components other than components desired for description may not be illustrated in the drawing.

Figure 5:
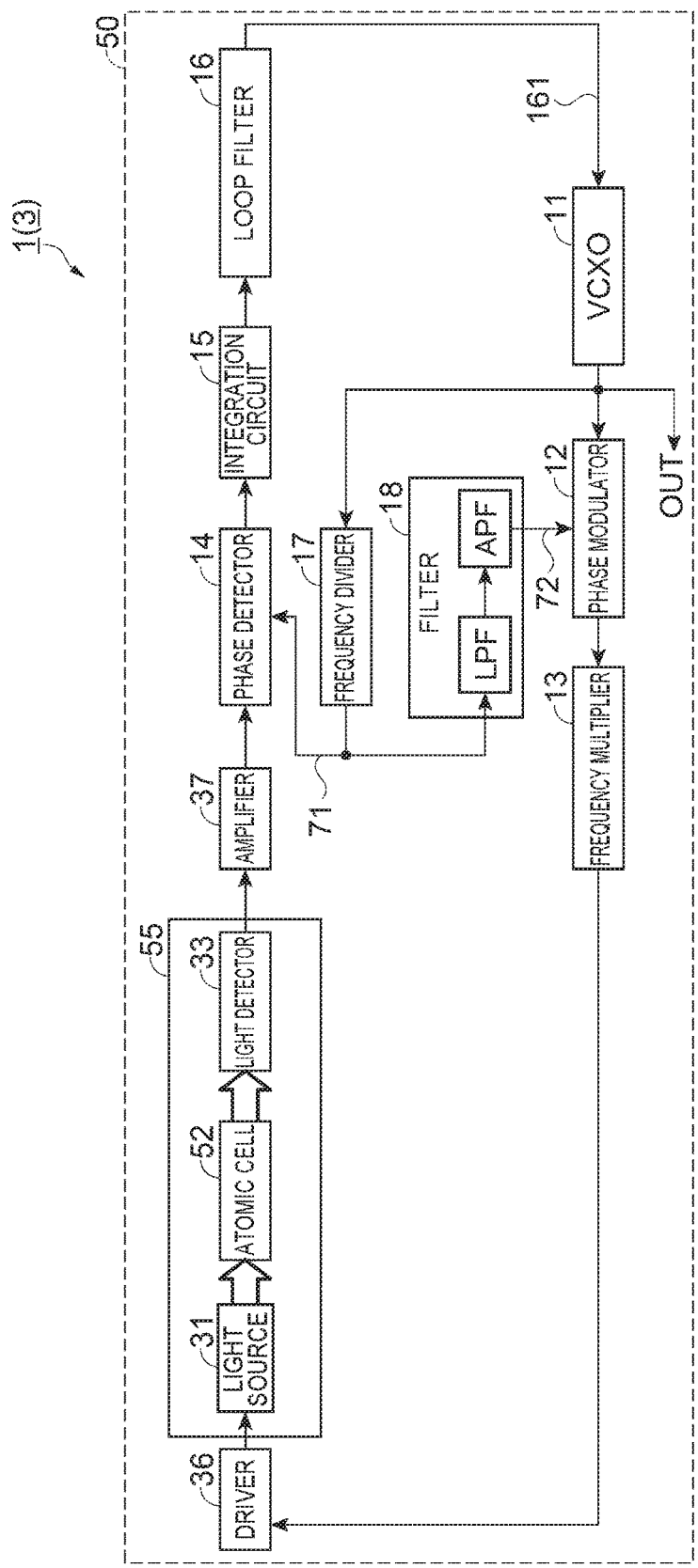
FIG. 5 is a diagram illustrating the overall configuration of an atomic oscillator using a double resonance phenomenon.

FIG. 5 is a diagram illustrating the overall configuration of a rubidium atomic oscillator 3 (atomic oscillator 1 using a double resonance phenomenon) to which the invention is applied. The principle of the double resonance phenomenon in the rubidium atomic oscillator 3 is known (for example, paragraph [0007] of JP-A-9-98086 and the like), and thus a detailed description thereof will be omitted.

The rubidium atomic oscillator 3 includes a feedback loop 50 (indicated by a dashed line) which performs feedback control for stabilizing an oscillation frequency of a VCXO 11, similar to the cesium atomic oscillator 2 described in the first exemplary embodiment. The feedback loop 50 is a feedback control circuit including a driver 36, an atomic resonance device 55, an amplifier 37, a first phase detector 14, an integration circuit 15, a loop filter 16, the VCXO 11, a first phase modulator 12, and a frequency multiplier 13.

The atomic resonance device 55 includes an atomic cell 52 containing rubidium atoms, a light source 31 that generates light emitted to the atomic cell 52, and a light detector 33 that detects the emitted light having passed through the atomic cell 52.

The first phase modulator 12 applies phase modulation to a driving signal for driving the light source 31 so as to perform phase modulation of light emitted to the atomic cell 52, by using a first phase modulation signal 72 as a reference signal. On the other hand, the first phase detector 14 detects an output of the light detector 33 which is amplified by the amplifier 37 by using a first phase detection signal 71 as a reference signal. The detected output is converted into a level signal 161 of a stable voltage by the integration circuit 15 and the loop filter 16 and is input to the VCXO 11.

The first phase detection signal 71 is generated by performing frequency division of an output signal OUT of the VCXO 11 by the frequency divider 17 as a first frequency divider. The first phase modulation signal 72 is generated by removing a harmonic component from the first phase detection signal 71 which is a periodic signal of a rectangular wave by the filter 18 as a first filter. Therefore, the first phase modulation signal 72 is synchronous with the first phase detection signal 71, and is ideally a periodic signal of a sine wave.

The filter 18 includes a low pass filter LPF and an all pass filter APF, removes a harmonic component of the first phase detection signal 71 by the low pass filter LPF, and generates the first phase modulation signal 72 by performing phase adjustment taking a phase deviation occurring in the atomic resonance device 55 into consideration by the all pass filter APF.

With the above-described configuration, the feedback loop 50 performs control for bringing the center frequency of light generated by the light source 31 into close to an atomic resonance frequency of rubidium atoms to stably cause a double resonance phenomenon in the atomic resonance device 55. As a result, an oscillation frequency of the VCXO 11 can be highly stabilized, and thus it is possible to supply the output signal OUT having extremely high frequency stability as an output of the rubidium atomic oscillator 3.

Operational Effects

As described above, the rubidium atomic oscillator 3 (atomic oscillator 1) according to this exemplary embodiment can generate the phase modulation signal 72 serving as a reference signal of the phase modulator 12 and the phase detection signal 71 serving as a reference signal of the phase detector 14 by the frequency divider 17 and the filter 18 without including one or more low frequency oscillators as independent circuits. For this reason, it is possible to suppress increases in the size and current consumption of the rubidium atomic oscillator 3 (atomic oscillator 1) and to suppress an increase in cost.

Third Exemplary Embodiment

Next, an electronic device having the atomic oscillator 1 according to the invention therein will be described by taking a clock transmission system 600 as an example.

Figure 6:
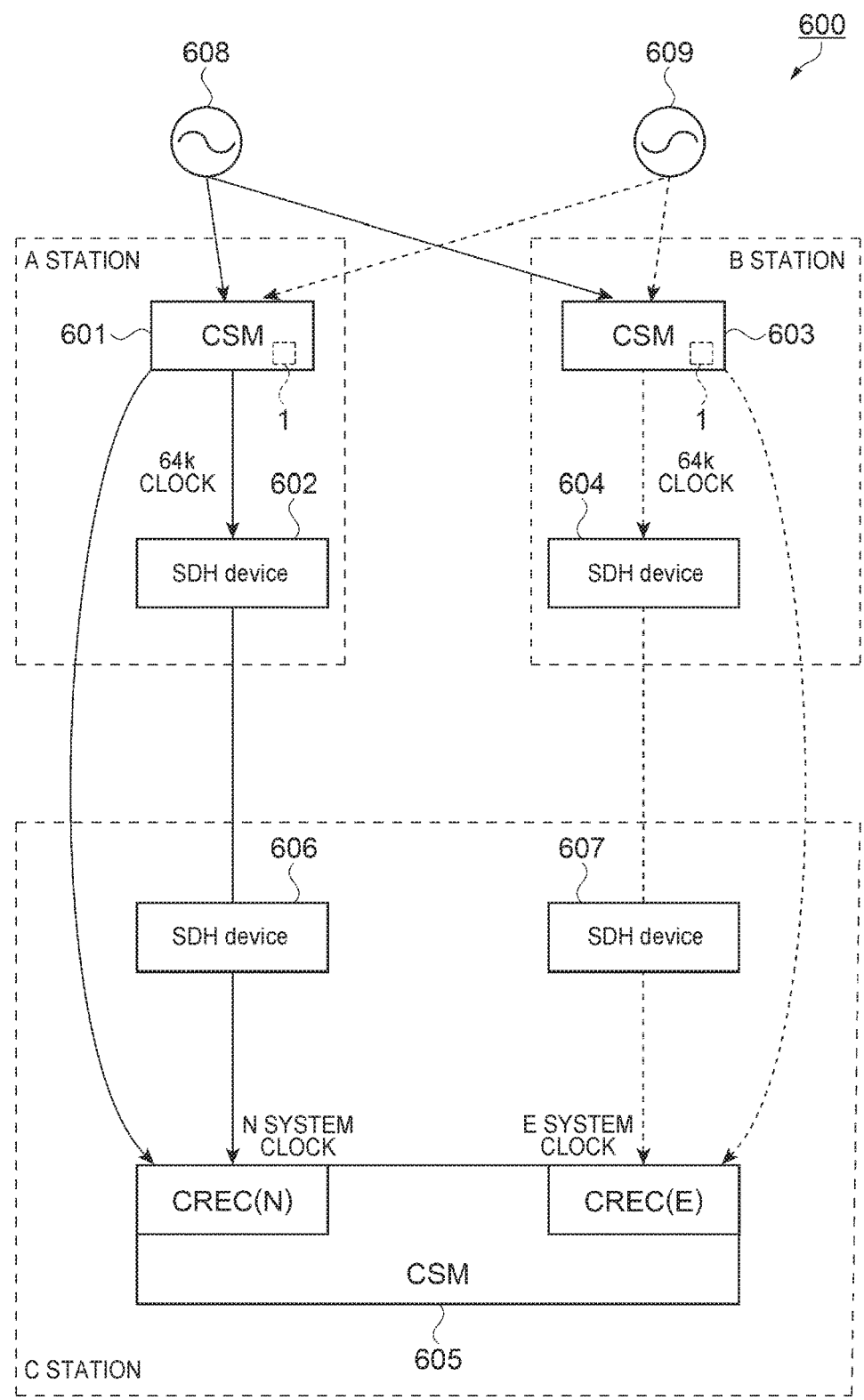
FIG. 6 is a schematic configuration diagram illustrating an example of a clock transmission system.

FIG. 6 is a schematic configuration diagram illustrating an example of the clock transmission system 600. The clock transmission system 600 is a system that makes clocks of respective devices within a network of time division multiplexing consistent with each other and has a redundancy configuration of a normal (N) system and an emergency (E) system.

The clock transmission system 600 includes a Clock Supply Module (CSM) 601 and a Synchronous Digital Hierarchy (SDH) device 602 of an A station (N system), a clock supply module 603 and an SDH device 604 of a B station (E system), and a clock supply module 605 and SDH devices 606 and 607 of a C station. The clock supply module 601 includes the atomic oscillator 1, and generates a clock signal of the N system. The atomic oscillator 1 within the clock supply module 601 generates a clock signal in synchronization with higher precision clock signals from master clocks 608 and 609.

The SDH device 602 transmits and receives a main signal on the basis of the clock signal from the clock supply module 601, superimposes a clock signal of the N system on the main signal, and transmits the signal obtained by the superimposition to the clock supply module 605 located at the lower level. The clock supply module 603 includes the atomic oscillator 1 and generates a clock signal of the E system. The atomic oscillator 1 within the clock supply module 603 generates a clock signal in synchronization with higher precision clock signals from the master clocks 608 and 609.

The SDH device 604 transmits and receives a main signal on the basis of the clock signal from the clock supply module 603, superimposes a clock signal of the E system on the main signal, and transmits the signal obtained by the superimposition to the clock supply module 605 located at the lower level. The clock supply module 605 receives the clock signals from the clock supply modules 601 and 603 and generates a clock signal in synchronization with the received clock signals.

Here, the clock supply module 605 normally generates a clock signal in synchronization with the clock signal of the N system from the clock supply module 601. In a case where abnormality occurs in the N system, the clock supply module 605 generates a clock signal in synchronization with the clock signal of the E system from the clock supply module 603. In this manner, it is possible to secure stably clock supply and increase the reliability of a clock pass network by switching from the N system to the E system. The SDH device 606 transmits and receives a main signal on the basis of the clock signal from the clock supply module 605. Similarly, the SDH device 607 transmits and receives a main signal on the basis of the clock signal from the clock supply module 605. Thereby, it is possible to synchronize the device of the C station with the device of the A station or the device of the B station.

Therefore, the clock transmission system 600 having the atomic oscillator 1 according to the invention therein has excellent reliability.

The electronic device having the atomic oscillator 1 according to the invention therein is not limited to the third exemplary embodiment, and may be any of the following devices. Some devices are, for example, a mobile phone, a digital still camera, an ink jet type discharge apparatus (for example, an ink jet printer), a personal computer (a mobile personal computer and a laptop type personal computer), a television, a video camera, a video tape recorder, a car navigation apparatus, a pager, an electronic organizer (an electronic organizer with a communication function is also included), an electronic dictionary, an electronic calculator, an electronic game machine, a word processor, a workstation, a video phone, a television monitor for security, electronic binoculars, a POS terminal, medical equipment (for example, an electronic thermometer, a sphygmomanometer, a blood sugar meter, an electrocardiographic measurement device, an ultrasonic diagnostic apparatus, and an electronic endoscope), a fish detector, various measurement apparatuses, instruments (for example, instruments for vehicles, aircraft, and ships), a flight simulator, and the like.

The invention is not limited to the above-described exemplary embodiments and the modification example, and can be implemented in various configurations without departing from the scope of the invention. For example, technical features in the exemplary embodiments and the modification example can be replaced or combined as appropriate in order to solve apart or all of the problems described above or achieve a part or all of the effects described above. Unless the technical features are not described in this specification as essential technical features, the technical features can be deleted as appropriate.

The entire disclosure of Japanese Patent Application No. 2016-246281 filed Dec. 20, 2016 is expressly incorporated herein by reference.

What is claimed is:

1. An atomic oscillator comprising:
   an atomic cell containing metal atoms;
   a light source configured to generate light to be emitted to the atomic cell;
   a driver configured to output a driving signal for driving the light source;
   a light detector configured to detect light that has passed through the atomic cell;
   a phase detector configured to detect an output of the light detector;
   a voltage controlled oscillator which has an oscillation frequency that is configured to be adjusted in correspondence with the output detected by the phase detector;
   a phase modulator configured to phase modulate an output signal of the voltage controlled oscillator to yield a phase modulated signal and to output the phase modulated signal;
   a frequency multiplier configured to output a microwave to the driver, the microwave being obtained by multiplying a frequency of the phase modulated signal; and
   a frequency divider configured to frequency divide the output signal of the voltage controlled oscillator to yield a frequency divided output signal and to output the frequency divided output signal to the phase detector and the phase modulator.

2. The atomic oscillator according to claim 1, wherein the atomic cell, the light source, the driver, the light detector, the phase detector, the voltage controlled oscillator, the phase modulator, and the frequency multiplier form a feedback loop configured to stabilize the oscillation frequency of the voltage controlled oscillator.

3. The atomic oscillator according to claim 2,
   wherein the feedback loop is configured to perform feedback control for making a center frequency of the light emitted from the light source substantially equal to an atomic resonance frequency of the atomic cell.

4. The atomic oscillator according to claim 1,
   wherein the frequency divided signal is first phase detection signal, and
   wherein the phase detector detects the output of the light detector by using the phase detection signal.

5. The atomic oscillator according to claim 4, further comprising:
   a filter configured to generate a phase modulation signal from the phase detection signal,
   wherein the phase modulator is configured to phase modulate the output signal in correspondence with the phase modulation signal.

6. The atomic oscillator according to claim 4, further comprising:
   a constant current circuit configured to generate a bias current,
   wherein the driver is configured to superimpose the bias current on the microwave to generate the driving signal.

7. The atomic oscillator according to claim 6, further comprising:
   a second phase detector configured to detect the output of the light detector based on a second phase detection signal,
   wherein the constant current circuit receives a level signal corresponding to the output detected by the second phase detector and is configured to adjust a value of the bias current based on the level signal.

8. The atomic oscillator according to claim 7,
   wherein the constant current circuit receives a bias fluctuation signal obtained by synchronizing the second phase detection signal with a phase, and is configured to adjust the value of the bias current based on the bias fluctuation signal.

9. The atomic oscillator according to claim 7, further comprising:
   a second frequency divider that frequency divides the output signal of the voltage controlled oscillator to generate the second phase detection signal with a frequency that is different from a frequency of a first phase detection signal.

10. The atomic oscillator according to claim 9,
    wherein the second frequency divider is configured to frequency divide the frequency divided output signal which has been output from the frequency divider.

11. The atomic oscillator according to claim 8, further comprising:

a second filter configured to generate the bias fluctuation signal from the second phase detection signal.

12. The atomic oscillator according to claim 7, further comprising:
a second feedback loop which includes the atomic cell, the light source, the driver, the constant current circuit, the light detector, and the second phase detector.

13. A method of generating atomic oscillation comprising:
providing an atomic cell containing metal atoms;
emitting light from a light source to the atomic cell;
driving the light source with a driving signal from a driver;
detecting light passed through the atomic cell with a light detector;
detecting an output of the light detector with a phase detector;
adjusting an oscillation frequency of a voltage controlled oscillator in correspondence with the output detected by the phase detector;
phase modulating an output signal of the voltage controlled oscillator with a phase modulator to yield a phase modulated signal and outputting the phase modulated signal from the phase modulator;
outputting a microwave from a frequency multiplier to the driver, the microwave being obtained by multiplying a frequency of the phase modulated signal with the frequency multiplier; and
frequency dividing the output signal of the voltage controlled oscillator with a frequency divider to yield a frequency divided output signal and outputting the frequency divided output signal from the frequency divider to the phase detector and the phase modulator.

14. The method according to claim 13, further comprising:
stabilizing the oscillation frequency of the voltage controlled oscillator with a feedback loop including the atomic cell, the light source, the driver, the light detector, the phase detector, the voltage controlled oscillator, the phase modulator, and the frequency multiplier.

15. The method according to claim 14, further comprising:
making a center frequency of the light emitted from the light source substantially equal to an atomic resonance frequency of the atomic cell using feedback control in the feedback loop.

16. The method according to claim 13, further comprising:
detecting the output of the light detector with the phase detector by using a phase detection signal, the phase detection signal being the frequency divided signal.

17. The method according to claim 16, further comprising:
generating a phase modulation signal from the phase detection signal with a filter; and
phase modulating the output signal in correspondence with the phase modulation signal with the phase modulator.

18. The method according to claim 16, further comprising:
generating a bias current with a constant current circuit; and
superimposing the bias current on the microwave to generate the driving signal with the driver.

19. The method according to claim 18, further comprising:
detecting the output of the light detector based on a second phase detection signal of a second phase detector; and
receiving a level signal corresponding to the output detected by the second phase detector at the constant current circuit and adjusting a value of the bias current based on the level signal.

20. The method according to claim 19, further comprising:
receiving a bias fluctuation signal at the constant current circuit, the bias fluctuation signal being obtained by synchronizing the second phase detection signal with a phase, and adjusting the value of the bias current based on the bias fluctuation signal.

* * * * *